(12) United States Patent
Pontoh et al.

(10) Patent No.: US 7,414,297 B2
(45) Date of Patent: *Aug. 19, 2008

(54) CAPACITOR CONSTRUCTIONS

(75) Inventors: Marsela Pontoh, Boise, ID (US); Cem Basceri, Boise, ID (US); Thomas M. Graettinger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/859,116

(22) Filed: Sep. 21, 2007

(65) Prior Publication Data

US 2008/0012093 A1 Jan. 17, 2008

Related U.S. Application Data (60) Continuation of application No. 11/485,926, filed on Jul. 12, 2006, now Pat. No. 7,274,059, which is a division of application No. 10/841,686, filed on May 6, 2004, now Pat. No. 7,274,061, which is a division of application No. 10/454,302, filed on Jun. 3, 2003, now Pat. No. 6,964,901.

(51) Int. Cl.
*H01L 27/108* (2006.01)
*H01L 29/943* (2006.01)

(52) U.S. Cl. ............... 257/534; 257/303; 257/309; 257/311; 257/317; 438/255; 438/396; 438/669; 438/964

(58) Field of Classification Search ........... 257/303, 257/309, 311, 317; 438/255, 398, 669, 964
See application file for complete search history.

(56) References Cited

U.S. PATENT DOCUMENTS

| | | | |
|---|---|---|---|
| 5,700,710 A | 12/1997 | Zenke | |
| 6,103,570 A * | 8/2000 | Sandhu et al. | ........... 438/255 |
| 6,236,080 B1 | 5/2001 | Lou | |
| 6,524,927 B1 | 2/2003 | Sugawara et al. | |
| 6,723,613 B2 | 4/2004 | Huang | |
| 6,753,618 B2 | 6/2004 | Basceri et al. | |
| 6,815,753 B2 | 11/2004 | Sandhu | |
| 7,274,059 B2 * | 9/2007 | Pontoh et al. | ........... 257/296 |
| 2001/0012656 A1 | 8/2001 | Rhodes et al. | |
| 2002/0043681 A1 | 4/2002 | Tsu et al. | |
| 2003/0129807 A1 | 7/2003 | Ping et al. | |

\* cited by examiner

*Primary Examiner*—Kenneth Parker
*Assistant Examiner*—Joseph Nguyen
(74) *Attorney, Agent, or Firm*—Wells St. John P.S.

(57) ABSTRACT

The invention includes methods of forming rugged electrically conductive surfaces. In one method, a layer is formed across a substrate and subsequently at least partially dissociated to form gaps extending to the substrate. An electrically conductive surface is formed to extend across the at least partially dissociated layer and within the gaps. The electrically conductive surface has a rugged topography imparted by the at least partially dissociated layer and the gaps. The topographically rugged surface can be incorporated into capacitor constructions. The capacitor constructions can be incorporated into DRAM cells, and such DRAM cells can be incorporated into electrical systems.

3 Claims, 11 Drawing Sheets

_Fig. 20_

_Fig. 21_

CAPACITOR CONSTRUCTIONS

RELATED PATENT DATA

This patent resulted from a continuation of U.S. patent application Ser. No. 11/485,926, which was filed Jul. 12, 2006 now U.S. Pat. No. 7,274,059, which is hereby incorporated by reference; which resulted from a divisional application of U.S. patent application Ser. No. 10/841,686, which was filed May 6, 2004 now U.S. Pat. No. 7,274,061, which is hereby incorporated by reference; which resulted from a divisional application of U.S. patent application Ser. No. 10/454,302, which was filed Jun. 3, 2003, which issued as U.S. Pat. No. 6,964,901, and which is hereby incorporated by reference.

TECHNICAL FIELD

The invention pertains to capacitor constructions comprising rugged materials, and pertains to methods of forming rugged electrically conductive surfaces and layers.

BACKGROUND OF THE INVENTION

Rugged surfaces are utilized in numerous semiconductor constructions. For instances, rugged silicon-containing surfaces are frequently utilized as electrodes of capacitor constructions. The rugged surfaces can increase the surface area of the electrodes, and can thereby increase the amount of capacitance per unit surface area of the electrodes relative to a non-rugged surface. An exemplary form of rugged silicon is hemispherical grain (HSG) silicon.

Various problems can exist during the integration of rugged silicon into capacitors and other semiconductor devices. For instance, the conductivity and other physical properties of silicon are frequently not as good as those associated with other conductive materials, such as, for example, metal-containing materials. Accordingly, there would be advantages to utilization of metal-containing materials in place of rugged silicon. Unfortunately, it is typically difficult to form a rugged surface associated with a metal-containing material. Thus, if the improved properties of metal-containing compositions are desired in a semiconductor structure, such properties are typically obtained at the expense of utilizing a material lacking a rugged surface. It would therefore be desirable to develop methodology for forming metal-containing materials having rugged surfaces. It would be further desirable to incorporate such materials into semiconductor constructions, such as, for example, capacitor constructions.

Although methodology of the present invention was developed in light of the above-described desired aspects, it is to be understood that the methodology is not limited to such aspects. Accordingly, methodology of the present invention can be utilized not only for forming metal-containing materials having rugged surfaces, but can also be utilized for forming other materials having rugged surfaces.

SUMMARY OF THE INVENTION

In one aspect, the invention pertains to a method of forming a rugged electrically conductive surface. A composition is formed as a continuous layer across an electrically insulative surface of a substrate. The continuous layer is at least partially dissociated to form gaps extending to the electrically insulative surface. An electrically conductive surface is formed to extend across the dissociated layer and within the gaps. The electrically conductive surface has a rugged topography imparted by the dissociated layer and the gaps.

In another aspect, a method of forming a rugged electrically conductive surface comprises forming a silicon-containing layer across a substrate, and subsequently dissociating at least a portion of the silicon-containing layer into a plurality of structures spaced from one other by gaps extending to the substrate. An electrically conductive surface is formed to extend across the structures and across the gaps between the structures, with such surface having a rugged topography imparted by the structures and gaps.

In another aspect, the invention encompasses a capacitor construction. The construction includes a plurality of spaced islands (also referred to herein as seeds) over a substrate, with the islands having silicide-containing surfaces. A first conductive material extends between the spaced islands and electrically connects the islands with one another. The first conductive material has a different composition than the islands. A dielectric material is over the first conductive material, and a second conductive material is over the dielectric material. The capacitor construction can be included within dynamic random access memory (DRAM) devices, and the DRAM devices can be included within electrical systems.

BRIEF DESCRIPTION OF THE DRAWINGS

Preferred embodiments of the invention are described below with reference to the following accompanying drawings.

FIG. 3 is a top view of a portion of a wafer comprising the FIG. 2 wafer fragment, and FIG. 3 illustrates one embodiment of the FIG. 2 aspect of the invention.

FIG. 4 is a top view of a portion of a wafer comprising the FIG. 2 wafer fragment. The FIG. 4 portion is different than that of FIG. 3, and FIG. 4 illustrates a different embodiment of the FIG. 2 aspect of the invention than does FIG. 3.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

One aspect of the invention is a recognition that seeds (or islands), and/or partially dissociated materials can be utilized for rough metal formation (with the term "rough metal" referring to a metal having a rugged surface). The seed and/or partially dissociated material can be a semiconductor-containing material, such as, for example, a silicon-containing material. In particular aspects, methodologies traditionally utilized for forming hemispherical grain silicon can be utilized to form the seed and/or partially-dissociated material of the present invention. The rough metal can be utilized in various semiconductor devices, and in particular aspects can be utilized as an electrode in a capacitor. The rough metal can thus replace hemispherical grain silicon in capacitor assemblies.

Figure 1:
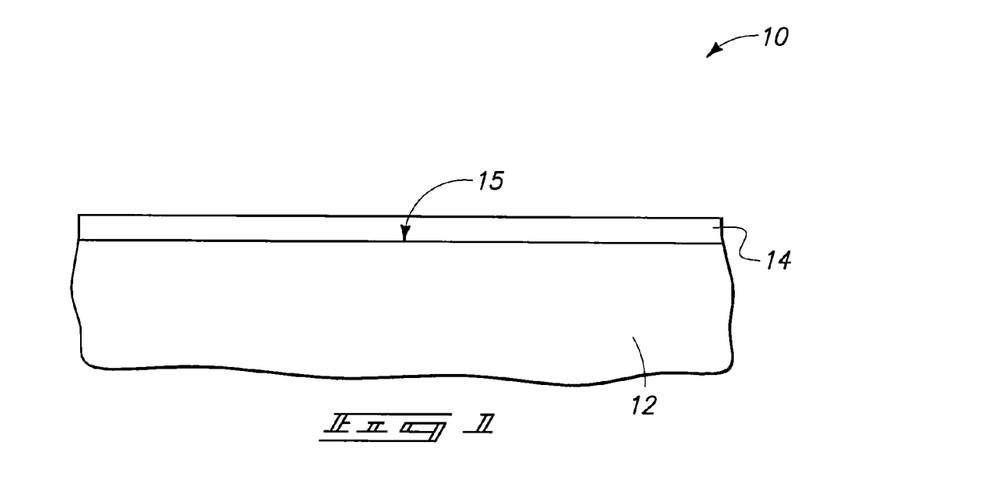
FIG. 1 is a diagrammatic, cross-sectional view of a semiconductor wafer fragment at a preliminary processing stage of an exemplary aspect of the present invention.

A first exemplary aspect of the invention is described with reference to FIGS. 1-8. Referring to FIG. 1, a semiconductor wafer fragment 10 comprises a substrate 12 having an upper surface 15. Substrate 12 can comprise, for example, monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A continuous layer 14 is formed over surface 15, and in the shown aspect of the invention is formed physically against surface 15. The layer is continuous across the shown fragment, and accordingly is continuous over at least a portion of the wafer comprising the shown fragment. The layer may, in particular aspects, be continuous over an entire surface of the wafer, and may, in other aspects, be continuous over only portions of the wafer surface. Layer 14 can comprise any appropriate composition which can be subsequently at least partially dissociated. In particularly aspects, layer 14 comprises, consists essentially of, or consists of silicon. If the composition of layer 14 comprises a semiconductive material (such as, for example, silicon) the composition can be essentially undoped at the processing stage of FIG. 1 (i.e., can have less than $1\times10^{18}$ atoms/cm$^3$ of conductivity-enhancing dopant therein), or can be doped (i.e., can comprise at least $10^{18}$ atoms/cm$^3$ of conductivity-enhancing dopant therein). Layer 14 can have any suitable thickness, and in particularly aspects will have a thickness of from about 50 Å to about 200 Å.

Figure 2:
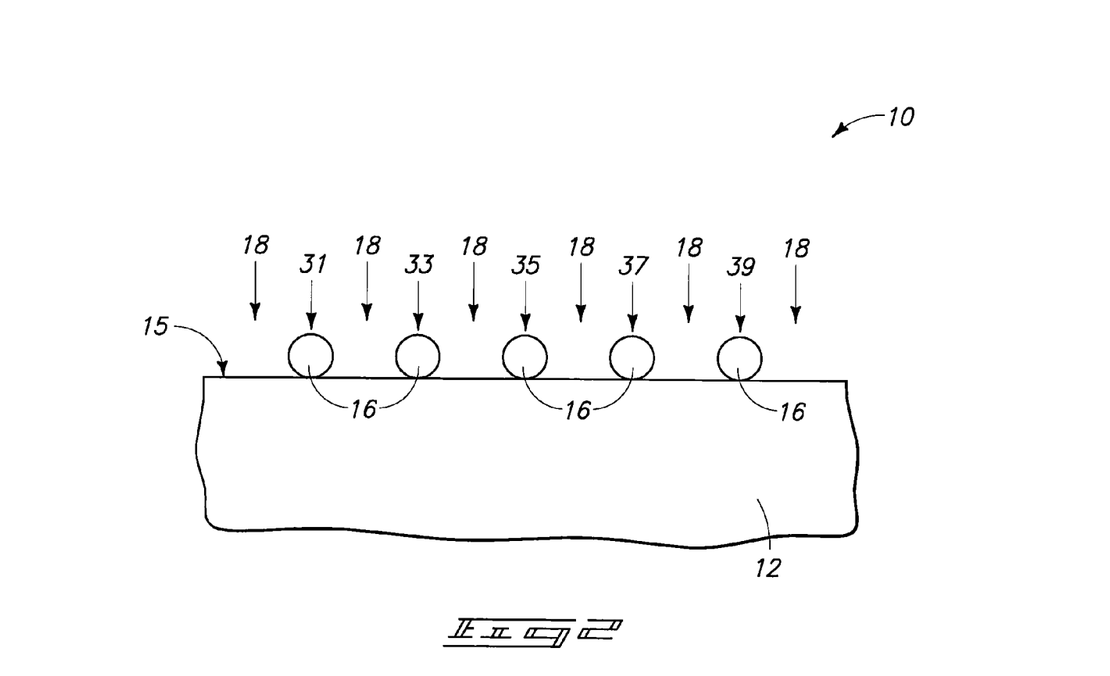
FIG. 2 is a view of the FIG. 1 wafer fragment shown at a processing stage subsequent to that shown of FIG. 1.

Referring next to FIG. 2, layer 14 (FIG. 1) is at least partially dissociated. In the shown cross-sectional view, the dissociation forms a plurality of spaced structures 16. If structures 16 are spaced from one another in all dimensions, the structures can be considered to correspond to discrete islands or seeds. In applications in which layer 14 comprises silicon, the dissociation of layer 14 into spaced structures 16 can be accomplished by, for example, heating the silicon-containing layer 14 to a temperature of at least about 500° C. for a time of at least about 1 minute, and in particular aspects the layer will be heated to a temperature of about 600° C. for a time of from about 1 minute to about 30 minutes.

It is recognized that separated structures have previously been formed from numerous materials through utilization of patterned masks. Specifically, photolithographic patterning is utilized to form a patterned mask, and then a pattern is transferred from the mask to underlying materials utilizing a suitable etch. For purposes of interpreting this disclosure and the claims that follow, the terms "dissociation" and "breaking up" of layer 14 refer to processes in which the physical separation of layer 14 into spaced structures 16 is caused, at least in part, by something other than a transfer of a pattern from a patterned mask (such as, for example, the above-described annealing). Typically, the dissociation and/or breaking up of layer 14 will be an entirely maskless process, at least no mask will typically be present over the region where structures 16 are formed during the formation of structures 16.

The individual structures 16 are shown separated from one another by gaps 18 which extend to the upper surface 15 of substrate 12. Although all of the structures are equal in size and shape in the shown cross-sectional view, and are shown to be entirely separated from one another, it is to be understood that some of the structures could be different in size and shape relative to one another, and that some of the structures could merge together. Also, it is to be understood that although layer 14 can be broken into discrete islands, the invention encompasses other aspects in which the continuous layer is only partially dissociated to form gaps extending to substrate surface 15, and wherein at least portions of the partially dissociated layer extend around the gaps rather than being broken into discrete islands separated by the gaps.

Figure 3:
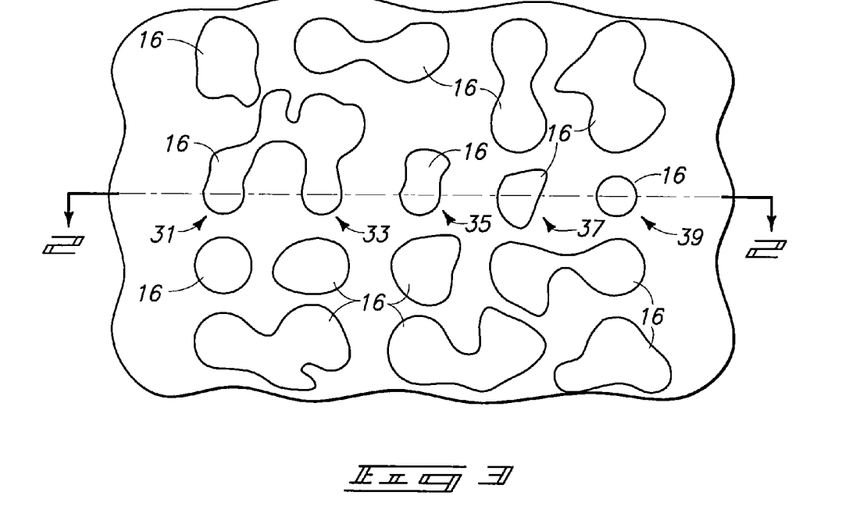
Figure 4:
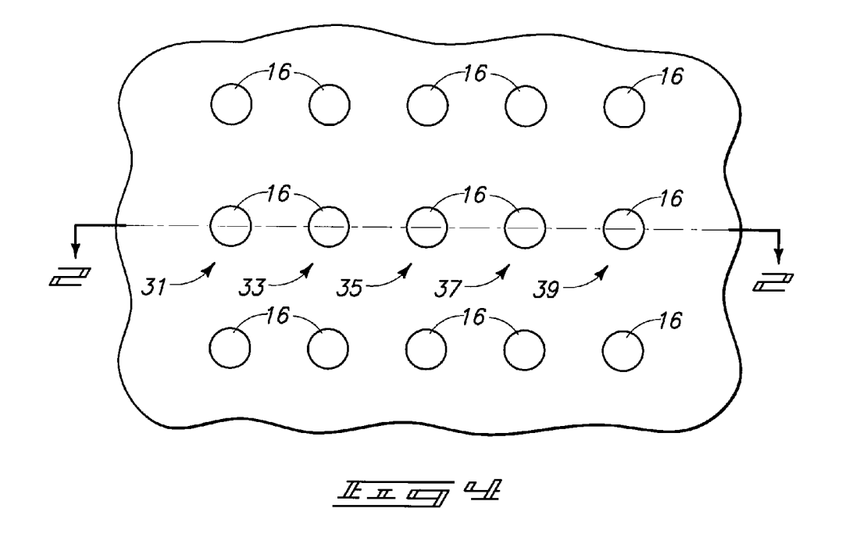

FIGS. 3 and 4 show top views of exemplary areas of different wafers comprise the FIG. 2 cross-section to illustrate different degrees and types of dissociation of layer 14 (FIG. 1). The individual FIG. 2 structures 16 are labeled as 31, 33, 35, 37 and 39 in FIGS. 2, 3 and 4 so that the structures can be readily recognized and compared across the figures. FIG. 3 shows a degree and type of dissociation in which two of the FIG. 2 structures (31 and 33) merge with one other, and in which the various structures 16 have numerous sizes and shapes even though the structures appear identical to one another in the cross-section of FIG. 2. FIG. 4 shows a degree of dissociation in which all of the structures 16 are separate islands having approximately the same size and shape as one another. As demonstrated by FIGS. 2, 3, and 4, structures which appear separate from one another in at least one cross-sectional view (e.g., the cross-sectional view of FIG. 2), may or may not be separate from one another in all dimensions.

The amount of dissociation of layer 14, the size of structures 16, and the separation between the individual structures, can be controlled by the initial thickness of layer 14 and the processing temperature and time utilized to dissociate layer 14. As discussed above, layer 14 can, in particular aspects, comprise either doped or undoped silicon. It can be advantageous to utilize undoped silicon, in that it is generally easier to dissociate undoped silicon than doped silicon. However, with suitable processing temperatures and times, doped silicon can also be dissociated to form structures 16.

In subsequent processing (described below) a conductive surface is formed across the structures 16 and the gaps 18 between the structures. The gaps and structures impart a rugged topography to such conductive surface. In some aspects, it can be desirable to treat structures 16 prior to, or during, the formation of such conductive surface. In one aspect, it can be desirable for structures 16 to have an electrically conductive surface suitable for incorporation into the rugged surface which is ultimately formed across substrate 12. If layer 14 (FIG. 1) comprises conductively-doped silicon, then the structures 16 resulting from dissociation of the layer will be electrically conductive. Alternatively, if layer 14 comprises undoped silicon, the structures 16 resulting from dissociation of the layer will not be electrically conductive. However, the structures can be converted to electrically conductive material by, for example, implanting conductivity-enhancing dopant into the structures, or by chemically treating the structures to convert at least the surfaces of the structures into electrically conductive materials.

Figure 5:
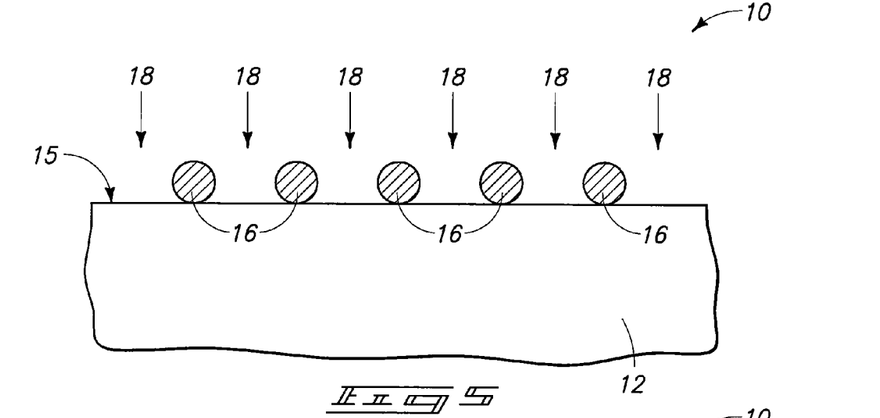
FIG. 5 is a view of the FIG. 1 wafer fragment shown at a processing stage subsequent to that shown of FIG. 2.

FIG. 5 illustrates the construction 10 after structures 16 have been converted to electrically conductive materials. If structures 16 comprise silicon, the structures can be converted to an electrically conductive material by converting the composition of the structures into a silicide. For instance, a chemical difference between the composition of structures 16 and the composition of surface 15 of substrate 12 can be utilized to enable selective conversion of structures 16 to electrically conductive materials while not converting the upper surface of substrate 12 to electrically conductive material. In a particular aspect, structures 16 can comprise silicon in a form which reacts with metal to form a metal silicide, and the upper surface 15 of substrate 12 can comprise a composition which does not react with metal to form a silicide. For instance, structures 16 can comprise non-oxidized silicon and surface 15 can comprise borophosphosilicate glass (BPSG). A suitable metal for reacting with non-oxidized silicon to form a silicide is titanium, which can react with silicon-containing structures 16 to form titanium silicide. The titanium silicide is preferably at least over the surfaces of the structures, and in particular aspects can penetrate entirely through the structures. The structures shown in the processing of FIG. 5 can, in particular aspects, comprise at least one metal silicide, in other aspects can consist essentially of at least one metal silicide, and in yet other aspects can consist of at least one metal silicide. If the metal utilized to form the metal silicide predominantly comprises titanium, then the structures 16 can predominantly comprise titanium silicide after reaction with the metal.

Figure 6:
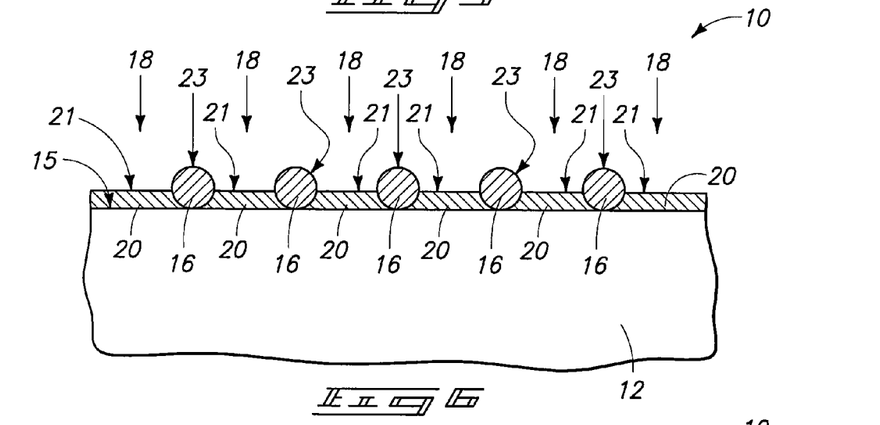
FIG. 6 is a view of the FIG. 1 wafer fragment shown at a processing stage subsequent to that shown of FIG. 5.

Referring to FIG. 6, an electrically conductive layer 20 is formed on surface 15 of substrate 12 (and specifically is shown formed physically against surface 15) and within the gaps 18 extending between structures 16. Layer 20 electrically connects the individual structures 16 to one another. In the shown aspect of the invention, layer 20 extends only between the structures 16, and not over the structures. In other aspects (discussed below) layer 20 can be formed over the structures as well as between the structures.

Layer 20 can comprise any suitable electrically conductive material, and in particular aspects will be a metal-containing layer. Layer 20 can, for example, predominantly comprise one or more metals (with the term "predominately comprise" indicating that the layer comprises more than 50 atomic percent of the one or more metals), consist essentially of one of more metals, or consist of one or more metals. In particular aspects, layer 20 will predominantly comprise, consist essentially of, or consist of one or more of titanium, tungsten, platinum, rhodium, tantalum, and ruthenium. An exemplary combination of metals that can be utilized in layer 20 is platinum and rhodium. Layer 20 can have any suitable thickness, and in particular aspects will have a thickness of from about 20 Å to about 70 Å.

Layer 20 has an electrically conductive surface 21, and structures 16 have electrically conductive surfaces 23. Surfaces 21 and 23 together define an electrically conductive surface extending across structures 16 and within the gaps 18 between the structures. Such electrically conductive surface has a rugged topography imparted by its undulation over the structures and within the gaps. In particular aspects, the electrically conductive surfaces of the structures 16 can be considered to be first electrically conductive surfaces, the electrically conductive surfaces of the conductive layer 20 can be considered to be second electrically conductive surfaces, and the rugged electrically conductive surface can be considered to be comprised of the first and second electrically conductive surfaces.

The conductive surfaces of the structures 16 can be formed by any suitable method. In some aspects, the conductive surfaces can be formed by converting silicon of the structures to silicide. In other exemplary aspects, structures 16 can comprise a semiconductor (such as silicon), and the conductive surfaces of structures 16 can be formed by providing conductivity-enhancing dopant within semiconductor of the structures to a sufficient concentration to form electrically conductive surfaces of the structures. To the extent that conductivity-enhancing dopant is provided within structures 16, such can be provided by forming conductivity-enhancing dopant within layer 14 at the processing stage of FIG. 1, (i.e., before breaking continuous layer 14 into structures 16); or alternatively can be provided into structures 16 during or after the processing stage of FIG. 2, (i.e., during or after breaking continuous layer 14 into structures 16).

Layer 20 can be formed by any suitable method, including, for example, atomic layer deposition (ALD), pulsed sequential deposition (PSD), chemical vapor deposition (CVD), etc.

Figure 7:
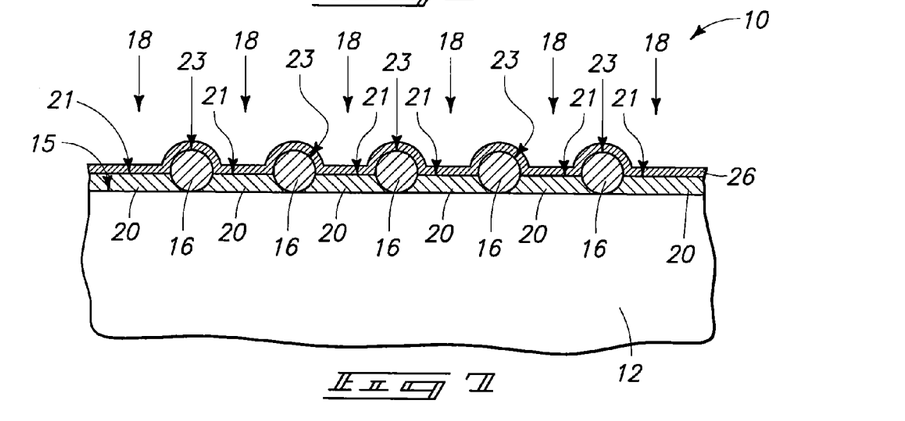
FIG. 7 is a view of the FIG. 1 wafer fragment shown at a processing stage subsequent to that shown of FIG. 6.

Referring to FIG. 7, a barrier layer 26 is optionally formed over surfaces 21 and 23. Barrier layer 26 can comprise, for example, a nitride and can be formed by either deposition of a desired nitride or by exposure of surfaces 21 and 23 to nitrogen-containing precursors to form the nitride from materials of surfaces 21 and 23. In an exemplary aspect, barrier layer 26 can comprise a metal nitride, and can be formed by one or more of ALD, PSD and CVD. Exemplary metal nitrides are titanium nitride, tungsten nitride, and tantalum nitride; and in some aspects, layer 26 can comprise, consist essentially of, or consist of one or more of titanium nitride, tungsten nitride, and tantalum nitride. Barrier layer 26 is shown as an electrically conductive material, but it is to be understood that the barrier layer could also be an electrically insulative material.

If surfaces 21 and 23 comprise materials which can react with nitrogen-containing precursors to form nitride, (such as, for example, silicon and/or appropriate metals) nitride layer 26 can be formed by exposing the surfaces 21 and 23 to $NH_3$, to $N_2$ in combination with $H_2$, and/or to other appropriate nitrogen-containing precursors. The exposure to the nitrogen-containing precursors can occur in combination with plasma and/or with an appropriate thermal anneal. If surfaces 21 and 23 comprise a metal, and if barrier layer 26 is a nitride-containing material formed by nitridization of the metal from surfaces 21 and 23, the layer 26 will contain at least one metal in common with the surfaces 21 and 23.

Conversion of surfaces 21 and 23 to nitride can occur within the same reaction chamber as is utilized for formation of conductive layer 20 (i.e., in situ with formation of conductive layer 20), or can occur in a separate reaction chamber than that utilized for formation of layer 20 (i.e., ex situ relative to formation of conductive layer 20).

Figure 8:
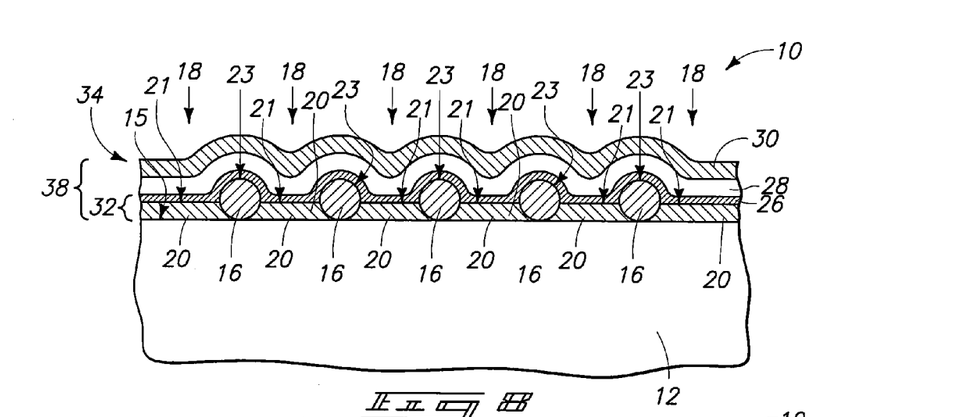
FIG. 8 is a view of the FIG. 1 wafer fragment shown at a processing stage subsequent to that shown of FIG. 7.

Referring to FIG. 8, a dielectric material 28 is formed over barrier layer 26, and a conductive material 30 is formed over dielectric material 28. Conductive materials 16, 20 and 26 can be considered to together form a first capacitor electrode 32, conductive material 30 can be considered to form a second capacitor electrode 34, and dielectric material 28 can be considered to capacitively separate the first and second capacitor electrodes from one another. Accordingly, capacitor electrodes 32 and 34, together with dielectric material 28, define a capacitor structure 38.

Barrier layer 26 is provided to prevent leakage across silicide of structures 16 relative to the dielectric material 28. In applications in which structures 16 do not comprise silicide, or in which the dielectric material does not comprise a composition in which leakage across a silicide is problematic, barrier layer 26 can be omitted. Particular dielectric materials for which leakage is typically not problematic are silicon nitride/silicon dioxide/silicon nitride (so-called ONO) dielectric layers. Dielectric layers commonly exhibiting leakage problems are the so-called high-K dielectric materials such as, for example, tantalum pentoxide.

Conductive material 30 can comprise any suitable material, including, for example, conductively-doped silicon and/or various metal-containing materials.

FIGS. 1-8 describe one aspect of the invention, another aspect is described with reference to FIGS. 9-11. Similar numbering will be utilized in the discussion of FIGS. 9-11 as was used above in describing FIGS. 1-8, where appropriate.

Figure 9:
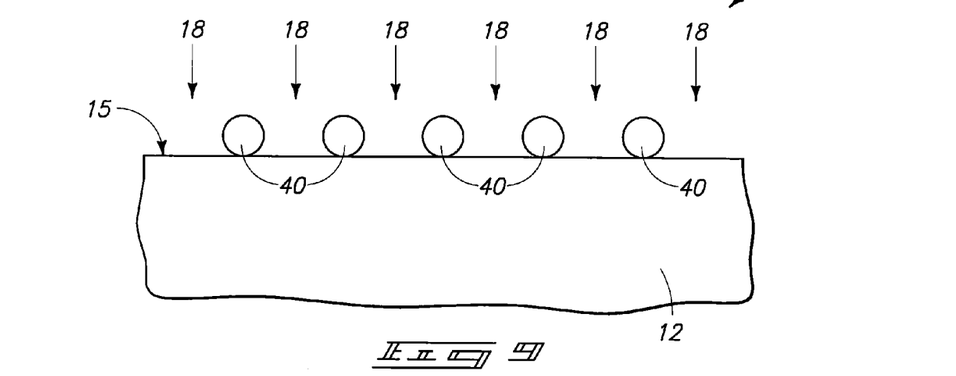
FIG. 9 is a view of the FIG. 1 wafer fragment shown at a processing stage subsequent to that of FIG. 2 in accordance with a second aspect of the present invention.

Referring to FIG. 9, construction 10 is shown at a processing stage subsequent to that of FIG. 2. Structures 16 (FIG. 2) have been chemically treated to convert the composition of the structures to a new material, and are labeled as structures 40 in FIG. 9 to emphasis that the composition of the structures is different than that of FIG. 2. A suitable treatment of the structures can be to expose the material of the structures to an oxidant so that the composition of the structures becomes an oxide. For instance, if the structures comprise, consist essentially of, or consist of silicon at the processing stage of FIG. 2, the structures can be exposed to oxygen under appropriate conditions to convert the composition of the structures to silicon dioxide. In such aspect of the invention, the structures 40 of FIG. 9 will comprise, consist essentially of, or consist of silicon dioxide.

Figure 10:
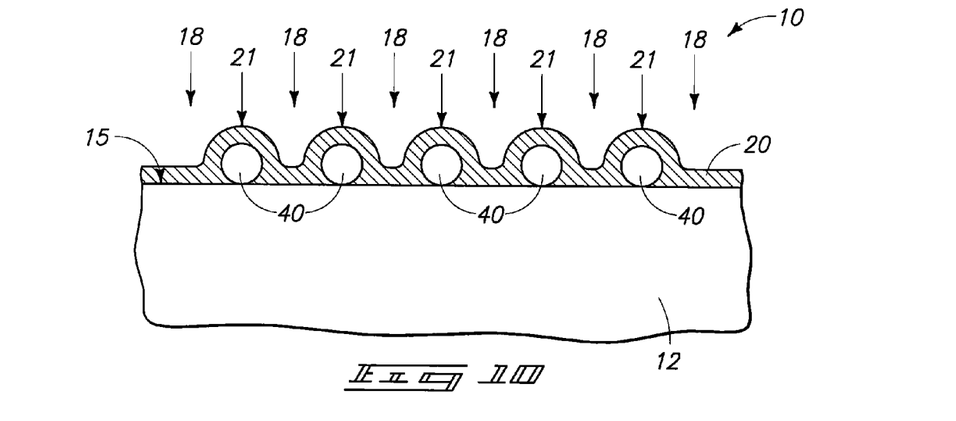
FIG. 10 is a view of the FIG. 9 wafer fragment shown at a processing stage subsequent to that of FIG. 9.

Referring to FIG. 10, a layer 20 of electrically conductive material is formed over structures 40 and within gaps 18 between the structures. Layer 20 can have an identical composition as the layer 20 described above with reference to FIG. 6. However, unlike the aspect described above with reference to FIG. 6, layer 20 of FIG. 10 is formed over the structures as well as within the gaps 18. Layer 20 of FIG. 10 has an upper surface 21. In the FIG. 10 aspect of the invention, upper surface 21 is a rugged surface, with the rugged topography of surface 21 being imparted by the structures 40 and gaps 18 underlying the surface.

Figure 11:
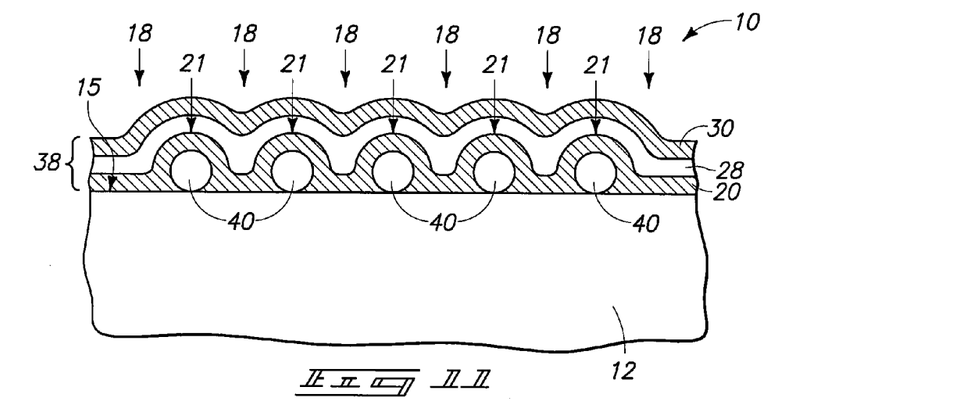
FIG. 11 is a view of the FIG. 9 wafer fragment shown at a processing stage subsequent to that of FIG. 10.

Referring to FIG. 11, dielectric material 28 is formed over layer 20, and subsequently conductive material 30 is formed over dielectric layer 28. Dielectric material 28 capacitively separates conductive material 20 from conductive material 30. Accordingly, a capacitor construction 38 is defined by conductive materials 20 and 30 in combination with dielectric material 28. Dielectric material 28 can comprise any suitable dielectric material, including, for example, silicon dioxide, silicon nitride, and/or various high-K dielectric materials (such as, for example, tantalum pentoxide). Conductive material 30 can comprise any suitable material, including, for example, conductively-doped silicon and/or various metal-containing materials.

A difference between the aspect of the invention shown in FIG. 11 and that described previously with reference to FIG. 8 is that the barrier layer 26 (FIG. 8) has been omitted from FIG. 11. Since structures 40 do not comprise silicide, it is unlikely that leakage across structures 40 will be a problem even if high-K dielectric materials are utilized for dielectric material 28. Accordingly, barrier layer 26 can be omitted from the aspect of FIG. 11. However, it is to be understood that even though barrier layer 26 is not shown in the FIG. 11 aspect of the invention, the barrier layer can be included in such construction if so desired. Also, it is noted that leakage can be a problem if layer 20 comprises silicide, even though structures 40 do not comprise silicide, and accordingly, if layer 20 comprises silicide it can be advantageous to include barrier layer 26 in the FIG. 11 structure.

Figure 12:
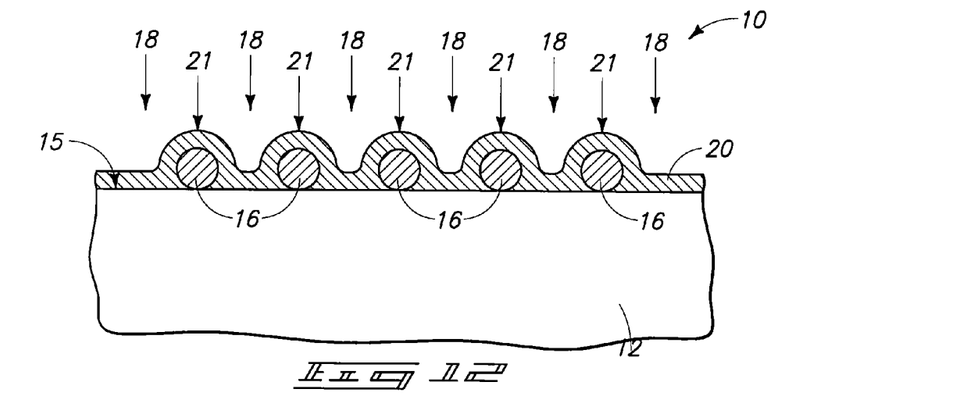
FIG. 12 is a view of the FIG. 1 wafer fragment shown at a processing stage subsequent to that of FIG. 2 in accordance with a third aspect of the invention.

Another aspect of the invention is described with reference to FIGS. 12 and 13. In referring to FIGS. 12 and 13, similar numbering will be used as is used above in describing FIGS. 1-11, where appropriate. FIG. 12 shows construction 10 at a processing stage subsequent to that of FIG. 2. Specifically, conductive material 20 has been formed over structures 16 and within the gaps 18 between the structures 16. Conductive material 20 typically comprises a metal-containing composition in the aspect of FIG. 12, and can, for example, comprise, consist essentially of, or consist of one or more appropriate metals. In an exemplary aspect, material 20 can comprise, consist essentially of, or consist of titanium. Layer 20 can comprise any suitable thickness, such as, for example, a thickness of from about 20 Å to about 70 Å.

Material 20 is utilized to convert structures 16 to electrically conductive compositions. In particular aspects, structures 16 will comprise, consist essentially of, or consist of silicon. After formation of layer 18, the structures 16 are subjected to appropriate processing to convert the silicon of such structures to metal silicide. Such metal silicide incorporates one or more metals from layer 18, and is formed by reaction of silicon from structures 16 with metal of material 20. If, for example, layer 18 predominantly comprises titanium, the metal silicide of structures 16 can predominantly comprise titanium silicide.

Although not shown in FIG. 12, the formation of silicide from the silicon of structures 16 and metal of layer 20 can cause some silicide to be formed within layer 20 in addition to the silicide formed within structures 16. This silicide formed within layer 20 can extend partially through the thickness of layer 20, or in other aspects can extend entirely through the thickness of layer 20. As discussed previously, it can be problematic to form a high-K dielectric material directly on a silicide as there can be leakage through the silicide. It can therefore be desired to either avoid having silicide penetrate entirely through the thickness of layer 20, or to form a barrier layer over layer 20 in the event that there may be silicide extending entirely through layer 20. A method of avoiding formation of silicide entirely through layer 20 is to form layer 20 of sufficient thickness to avoid having the silicide entirely penetrate through the layer. A method of forming a barrier layer over layer 20 is to utilize the processing described previously with reference to FIG. 7 to form a nitride-containing layer over layer 20.

Layer 20 comprises upper surface 21, and in the aspect of FIG. 12 such upper surface has a rugged topography imparted by the underlying structures 16 and gaps 18 between the structures.

Figure 13:
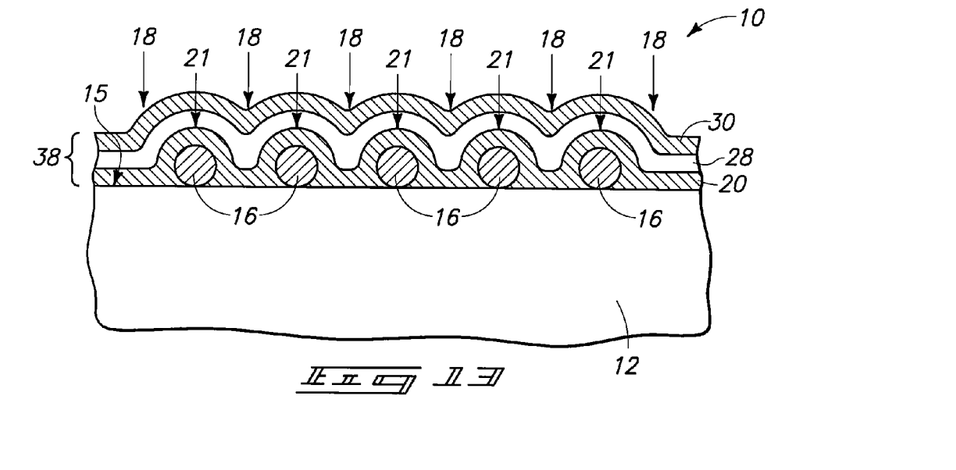
FIG. 13 is a view of the FIG. 12 wafer fragment shown at a processing stage subsequent to that of FIG. 12.

Referring to FIG. 13, dielectric material 28 and conductive material 30 are formed over conductive material 20. Conductive materials 20 and 30, together with dielectric material 28, can be considered to define a capacitor construction 38.

Dielectric material 28 and conductive material 30 can comprise the compositions described previously with reference to FIGS. 8 and 11. Although barrier layer 26 (FIGS. 7 and 8) is not shown in the construction of FIG. 13, it is to be understood that a nitride-containing barrier layer could be provided if so desired. For instance, as previously discussed above with reference to FIG. 12, silicide may, in particular aspects, penetrate entirely through the thickness of layer 20. If such occurs, and if dielectric material 28 comprises a high-K dielectric material, it may be desired to form a nitride-containing barrier layer over conductive material 20 prior to formation of dielectric material 28.

The various aspects described above with reference to FIGS. 1-13 can be utilized for fabrication of semiconductor structures. For instance, the constructions described above can be incorporated into DRAM cells. An exemplary method of forming a DRAM cell is described with reference to FIGS. 14-19.

Figure 14:
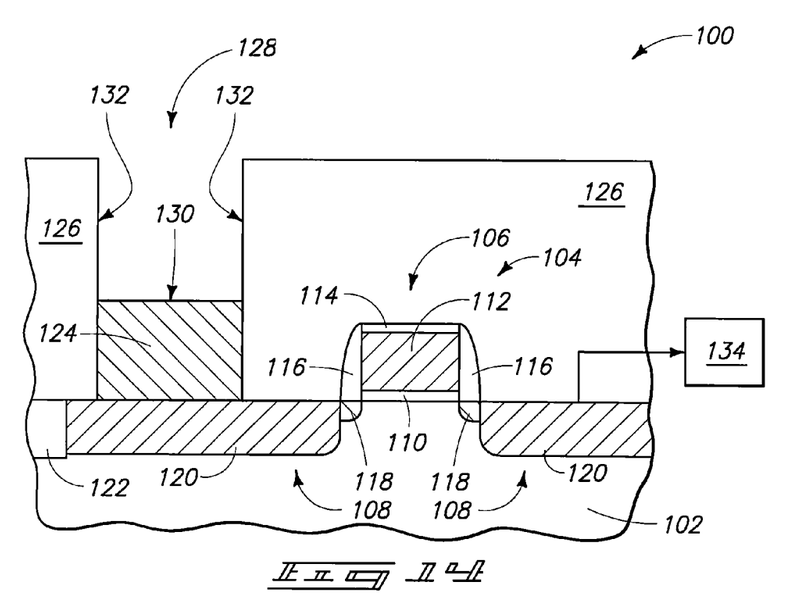
FIG. 14 is a diagrammatic, across-sectional view of a semiconductor wafer fragment shown at a preliminary processing stage of a fourth aspect of the invention.

Referring to FIG. 14, a wafer fragment 100 comprises a base 102. Base 102 can also be referred to as a substrate, and can comprise, for example, monocrystalline silicon.

A transistor device 104 is supported by base 102. Transistor device 104 comprises a transistor gate 106 over base 102, and source/drain diffusion regions 108 extending into base 102. Gate 106 and source/drain diffusion regions 108 can comprise conventional constructions and materials. The shown gate 106 comprises an insulative layer 110 (such as, for example, silicon dioxide), one or more conductive materials 112 over the insulative material, and an insulative cap 114. Sidewall spacers 116 are shown formed adjacent to gate 106. The source/drain diffusion regions 108 comprise shallow lightly-doped regions 118 under the sidewall spacers 116, and deep heavily-doped regions 120 outwardly of the lightly-doped regions 118.

An isolation region 122 is shown extending into base 102 adjacent one of the source/drain diffusion regions. Isolation region 122 can comprise, for example, a shallow trench isolation region and is utilized for electrically isolating transistor structure 104 from adjacent circuitry (not shown).

A conductive pedestal 124 is formed over one of the source/drain diffusion regions 108, and is in electrical contact with the source/drain diffusion region. The pedestal can comprise any suitable electrically conductive material, including, for example, conductively-doped silicon, metal, and/or metal-containing compounds.

Pedestal 124 has an upper surface 130 which defines an electrical node. It is to be understood that an electrical node can comprise other configurations besides the shown upper surface of pedestal 124. In particular aspects, the pedestal 124 can be eliminated and an upper surface of diffusion region 120 can constitute the electrical node.

An insulative material 126 is formed over base 102. Material 126 can comprise any suitable electrically insulative material, such as, for example, BPSG.

An opening 128 extends through insulative material 126 to upper surface 130 of pedestal 124. Opening 128 comprises a periphery having side surfaces 132, and comprises a bottom surface corresponding to the surface 130 of pedestal 124. The bottom surface of the opening is thus electrically conductive, and the side surfaces 132 are electrically insulative.

Construction 100 can be considered to comprise a substrate, with such substrate including the base 102, and including the electrical node 124 and the insulative material 126 supported by the base. Ultimately, a capacitor construction is formed within opening 128 (in processing described below), and is thus formed in electrical contact with one of the source/drain diffusion regions 108 of transistor construction 104. The other of the source/drain diffusion regions 108 is ultimately connected to a bitline 134. The connection to bitline 134 can occur before or after formation of the capacitor within opening 128.

Figure 15:
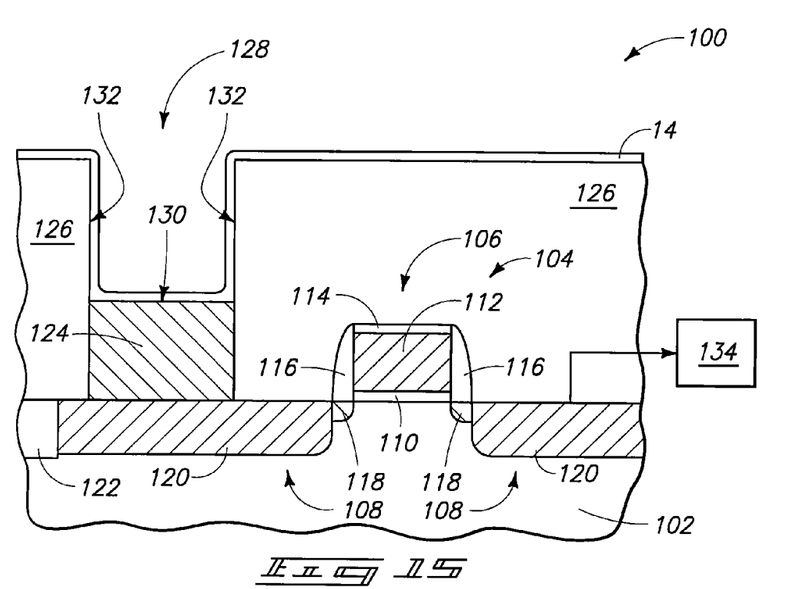
FIG. 15 is a view of the FIG. 14 wafer fragment shown at a processing stage subsequent to that of FIG. 14.

Referring to FIG. 15, layer 14 is formed over insulative material 126 and within opening 128. Layer 14 physically contacts insulative material 126 along sidewall peripheries 132 of opening 128, and physically contacts electrical node 130 at the bottom of opening 128. Layer 14 can have any of the compositions described above with reference to FIG. 1. Layer 14 can, in particular aspects, be considered a continuous layer extending over an upper surface of insulative material 126 and within opening 128. Layer 14 can be a silicon-containing layer, or can comprise any other suitable composition.

Figure 16:
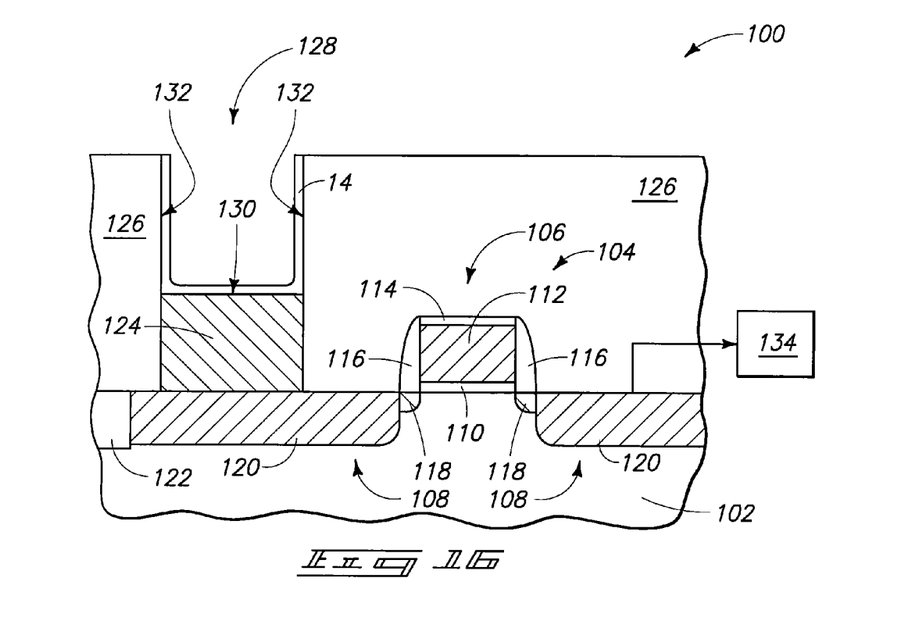
FIG. 16 is a view of the FIG. 14 wafer fragment shown at a processing stage subsequent to that of FIG. 15.

Referring to FIG. 16, layer 14 is removed from over the upper surface of insulative material 126, and left within opening 128. Such can be accomplished by any suitable processing, including, for example, chemical-mechanical polishing.

Figure 17:
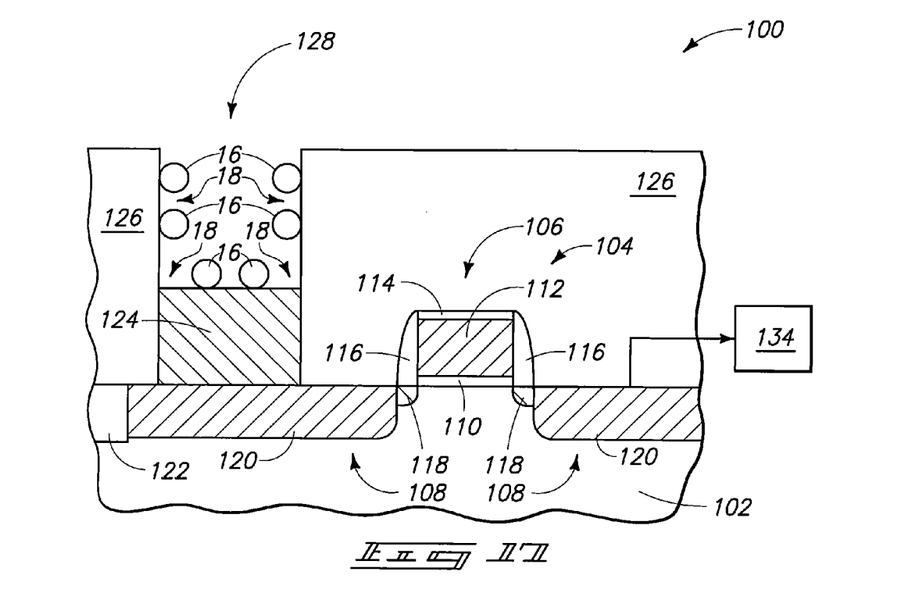
FIG. 17 is a view of the FIG. 14 wafer fragment shown at a processing stage subsequent to that of FIG. 16.

Referring to FIG. 17, layer 14 (FIG. 16) is subjected to appropriate processing to break the layer into spaced structures 16. If layer 14 is a silicon-containing layer, such processing can comprise, for example, heating the layer to a temperature of at least about 500° C. for a time of at least about 1 minute as described above with reference to FIG. 2.

Structures 16 are separated by gaps 18 which extend to conductive node 130 along the bottom periphery of opening 128, and which extend to insulative material 126 along the sidewall peripheries of opening 128.

Figure 18:
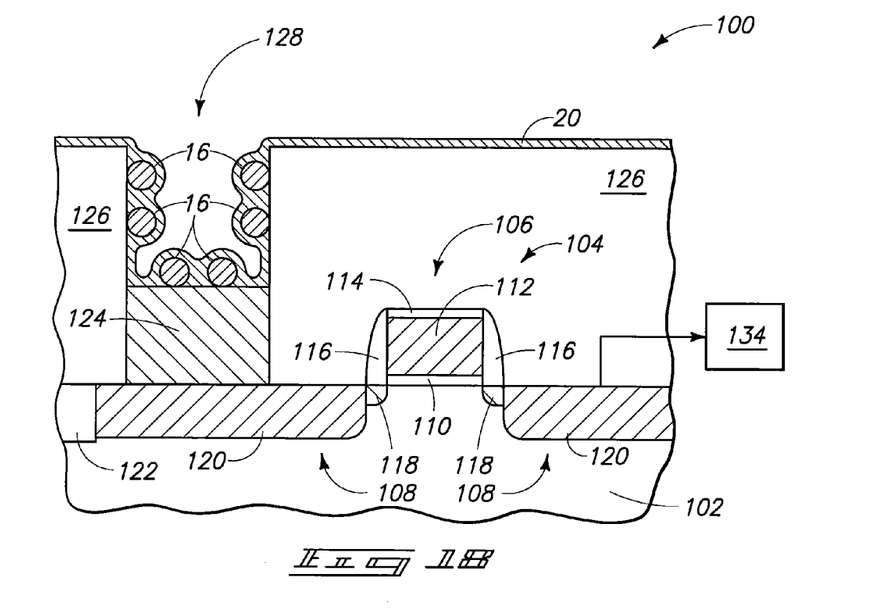
FIG. 18 is a view of the FIG. 14 wafer fragment shown at a processing stage subsequent to that of FIG. 17.

Referring to FIG. 18, conductive material 20 is formed over structures 16 and within the gaps 18 between the structures (the gaps 18 are labeled in FIG. 17, but not in FIG. 18). Conductive material 20 can comprise any suitable conductive material, and in particular aspects will comprise a metal-containing material. Structures 16 are converted to conductive material underlying layer 20. The conversion of structures 16 to the conductive material can be accomplished by, for example, initially providing structures 16 to comprise silicon, providing conductive material 20 to comprise metal; and, after formation of conductive material 20, exposing material 20 and structures 16 to appropriate processing to convert the silicon of structures 16 to one or more metal silicides. Such processing can be accomplished utilizing the methodology described previously with reference to FIG. 12.

Figure 19:
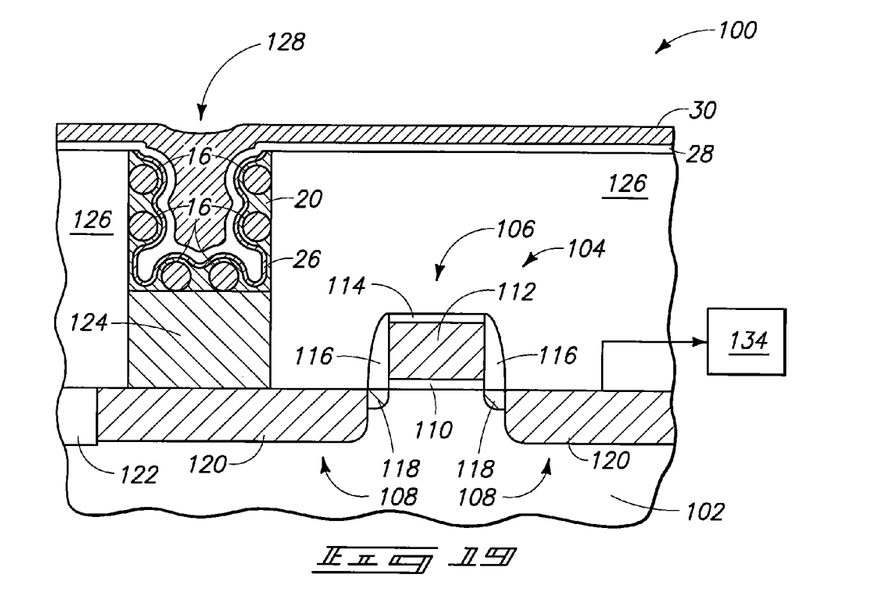
FIG. 19 is a view of the FIG. 14 wafer fragment shown at a processing stage subsequent to that of FIG. 18.

Referring to FIG. 19, conductive material 20 is removed from over an upper surface of insulative material 126 and left within opening 128 utilizing appropriate processing. Such processing can including, for example, chemical-mechanical polishing. An optional nitride-containing layer 26 is formed over conductive material 20. Nitride-containing layer 26 can be formed utilizing, for example, the methodology described previously with reference to FIG. 7, and accordingly can comprise deposition of a nitride-containing material and/or nitridization of an outer surface of conductive material 20.

A dielectric material 28 is provided over nitride-containing layer 26, and a conductive material 30 is provided over dielectric material 28. Pedestal 124 in combination with conductive materials of structures 16 and layers 20 and 26 can be considered to comprise a first capacitor electrode, conductive material 30 can be considered to comprise a second capacitor electrode capacitively separated from the first capacitor electrode by dielectric material 28. Accordingly, the first capacitor electrode, the second capacitor electrode, and the dielectric material 28 can be considered to form a capacitor construction. The capacitor construction is gatedly connected to bitline 134 through transistor construction 104. The capacitor and transistor of FIG. 19 can be considered to correspond to a DRAM cell.

As discussed previously, barrier layer 26 can be particularly advantageous in applications in which there is potential leakage across a silicide in the absence of the barrier layer. The construction of FIG. 19 can be one of such constructions. Specifically, if dielectric 28 comprises a high-K dielectric material, and if the suicide extends entirely through layer 20 as well as across the structures 16, there can be leakage between the high-K dielectric 28 and the electrical node 130 in the absence of barrier layer 26.

Figure 20:
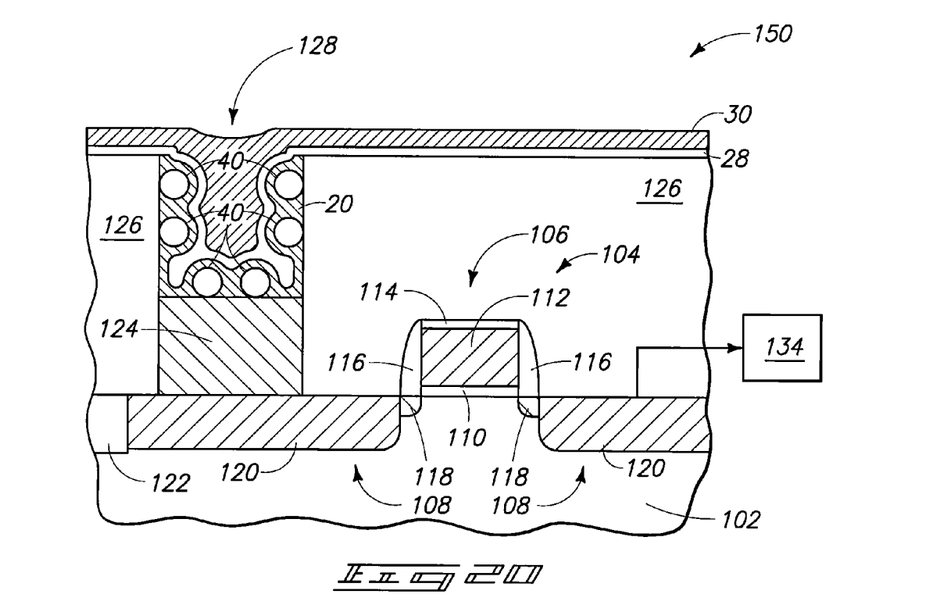
FIG. 20 is a diagrammatic, across-sectional view of a semiconductor wafer fragment illustrating a fifth aspect of the invention.

FIG. 20 illustrates another exemplary DRAM construction. In referring to FIG. 20, similar numbering will be used as was utilized above in describing FIGS. 14-19, where appropriate. FIG. 20 shows a construction 150 comprising the base 102, transistor construction 104, electrical node 130, and insulative material 126 described previously with reference to FIGS. 14-19. Construction 150 also includes the capacitor construction described previously with reference to FIG. 11. Such capacitor construction includes structures 40 of electrically insulative material, and conductive material 20 extending over the structures and within gaps between the structures. A dielectric material 28 is provided over conductive material 20, and a second conductive material 30 is provided over dielectric material 28. The conductive materials 20 and 30 correspond to capacitor electrodes, and are capacitively separated from each other by dielectric material 28.

Figure 21:
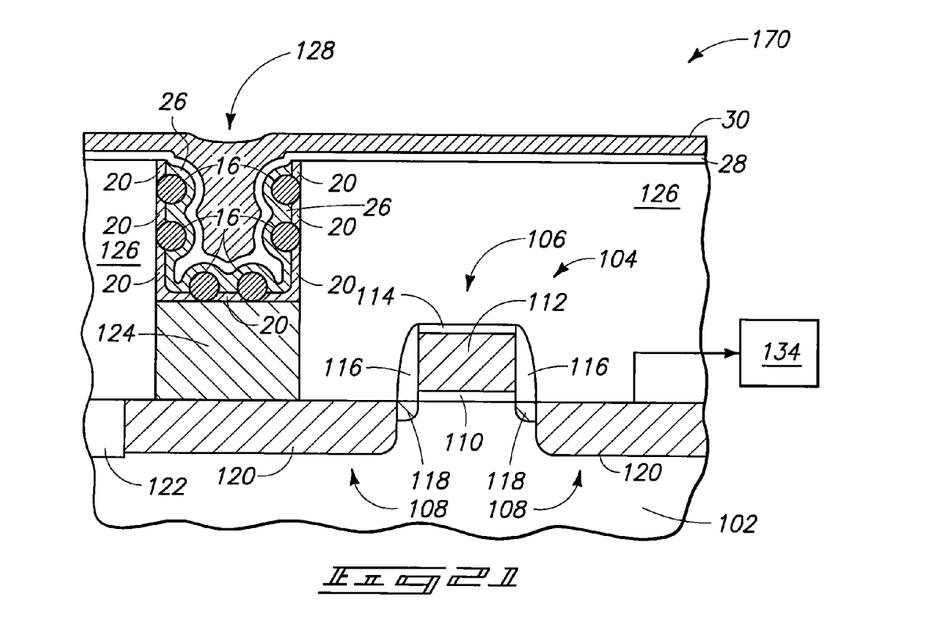
FIG. 21 is a diagrammatic, across-sectional view of a semiconductor wafer fragment illustrating a sixth aspect of the invention.

FIG. 21 shows a construction 170 comprising a DRAM unit cell utilizing the capacitor construction of FIG. 8. In referring to FIG. 21, similar numbering will be used as was utilized above in describing FIGS. 14-19, where appropriate. Construction 170 comprises the transistor construction 104, base 102, electrical node 130 and insulative material 126 described previously. The capacitor utilized in construction 170 includes electrically conductive structures 16, and electrically conductive material 20 extending between the structures but not over the structures. The capacitor construction also includes electrically conductive barrier layer 26 extending over conductive material 20 and over structures 16. A dielectric material 28 extends over the barrier layer, and a conductive material 30 extends over dielectric material 28.

Structures 16 can, as described previously, comprise any suitable conductive material. In particular aspects, conductive structures 16 can comprise conductively-doped silicon, and in other exemplary aspects the conductive structures can comprise one or more metal silicides, such as, for example, titanium silicide. To the extent that the conductive structures comprise silicide, it can be advantageous to include the nitride-containing barrier layer 26 over the silicide. If the structures do not comprise silicide, barrier layer 26 can be omitted, or replaced with a non-barrier material, such as, for example, a composition which does not include a nitride.

One common aspect of the capacitor constructions of FIGS. 19-21 is that the constructions include structures (16 or 40) spaced from one another by gaps, and include conductive material extending across such gaps, with the conductive material typically having a different composition than the structures. For instance, in the construction of FIG. 20, the structures (40) comprise an electrically insulative material and the material (20) extending across the gaps comprises electrically conductive material. In the constructions of FIGS. 19 and 21, the structures (16) comprise a first electrically conductive material, and the material (20) extending across the gaps between the structures can comprise a second electrically conductive material different from the first electrically conductive material. For instance, the structures can comprise metal silicide and/or conductively-doped silicon, and the conductive material extending between the structures can be a metal-containing material which is predominantly not metal silicide.

A circuit device comprising rugged material formed in accordance with methodology of the present invention (such as the above-described DRAM cells) can be utilized in numerous assemblies, including, for example, computer systems and other electronic systems.

Figure 22:
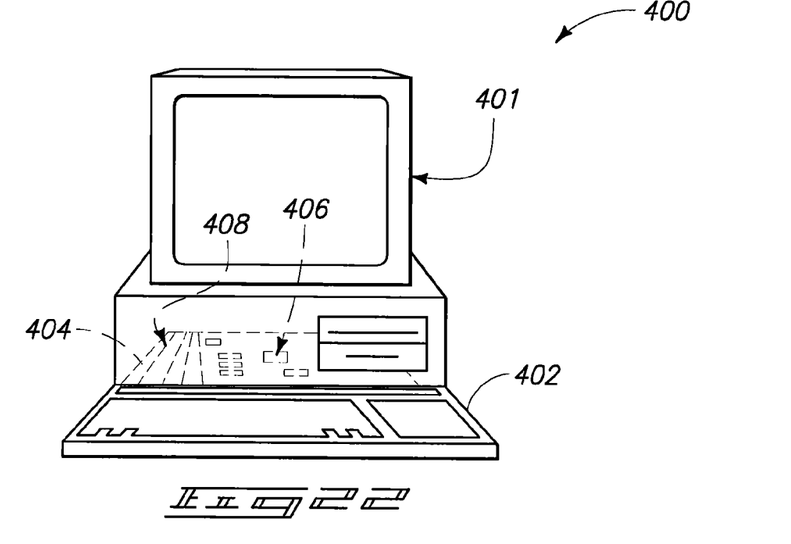
FIG. 22 is a diagrammatic view of a computer illustrating an exemplary application of the present invention.
Figure 23:
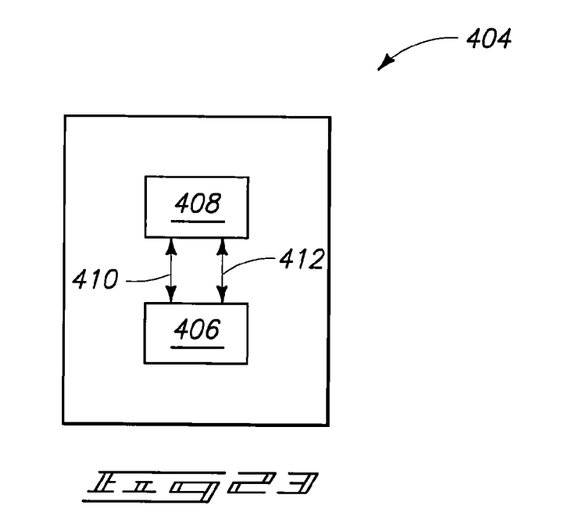
FIG. 23 is a block diagram showing particular features of the motherboard of the FIG. 22 computer.

FIG. 22 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, one or more of the DRAM unit cells described with reference to FIGS. 19-21. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 23. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation which utilizes the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Figure 24:
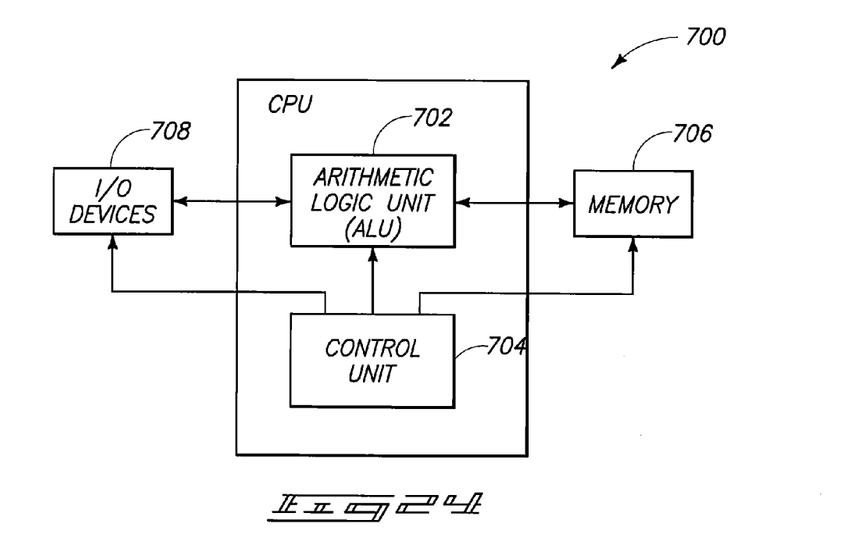
FIG. 24 is a high-level block diagram of an electronic system according to an exemplary aspect of the present invention.

FIG. 24 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells in accordance with various aspects of the present invention.

Figure 25:
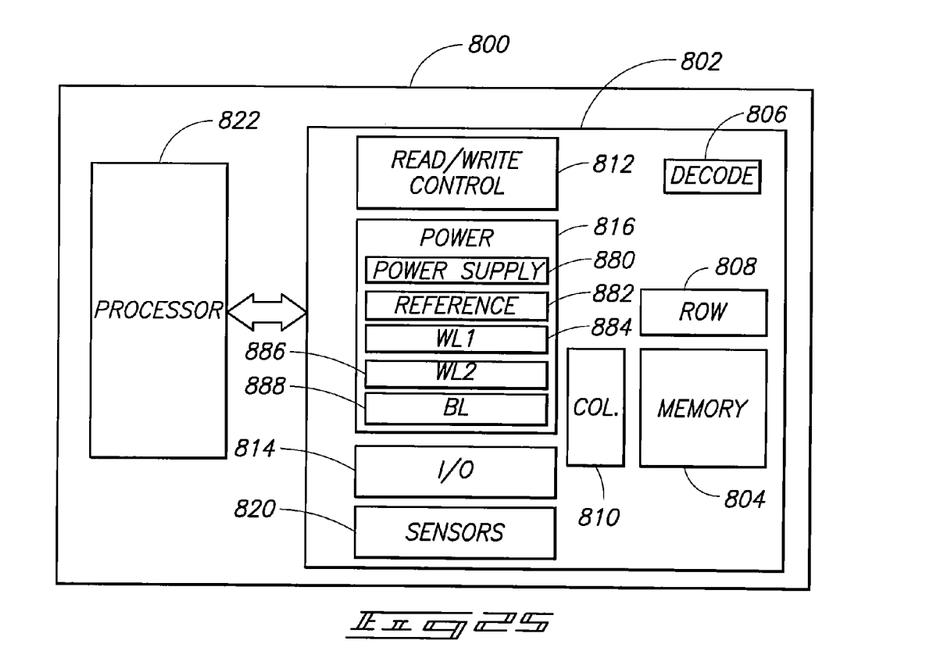
FIG. 25 is a simplified block diagram of an exemplary electronic system according to an aspect of the present invention.

FIG. 25 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a DRAM cell of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A capacitor construction, comprising:
   a semiconductor substrate supporting an electrical node and an electrically insulative material, the electrical node comprising metal, the electrically insulative material comprising borophosphosilicate glass;
   a plurality of structures spaced from one another by gaps; some of the gaps extending to the metal of the electrical node and some of the gaps extending to the borophosphosilicate glass of the electrically insulative material;
   a first electrically conductive material over the structures and gaps, the first electrically conductive material having a rugged topography imparted by the underlying structures and gaps;
   a dielectric material over the first electrically conductive material;
   a second electrically conductive material over the dielectric material; and
   wherein said structures consist essentially of metal silicide; wherein the first electrically conductive material comprises the metal of the metal silicide; and further comprising a nitrogen-comprising barrier layer between the first electrically conductive material and the dielectric material.

2. The construction of claim 1 wherein the barrier layer comprises a metal nitride; and wherein the metal of the metal nitride is the same as the metal of the metal silicide.

3. The construction of claim 1 wherein the barrier layer comprises titanium nitride; and wherein the metal silicide comprises titanium silicide.

* * * * *